United States Patent
King et al.

(10) Patent No.: US 10,580,476 B2
(45) Date of Patent: Mar. 3, 2020

(54) SIMULATING A SINGLE DATA RATE (SDR) MODE ON A DUAL DATA RATE (DDR) MEMORY CONTROLLER FOR CALIBRATING DDR MEMORY COARSE ALIGNMENT

(71) Applicant: INTERNATIONAL BUSINESS MACHINES CORPORATION, Armonk, NY (US)

(72) Inventors: Ryan P. King, Lagrangeville, NY (US); Stephen Glancy, Yorktown, VA (US); John S. Bialas, Jr., South Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/869,008

(22) Filed: Jan. 11, 2018

(65) Prior Publication Data
US 2019/0214073 A1 Jul. 11, 2019

(51) Int. Cl.
| | |
|---|---|
| *G11C 7/00* | (2006.01) |
| *G11C 11/4076* | (2006.01) |
| *G11C 11/4096* | (2006.01) |
| *G11C 29/10* | (2006.01) |
| *G11C 11/4093* | (2006.01) |

(Continued)

(52) U.S. Cl.
CPC ........ *G11C 11/4076* (2013.01); *G11C 7/1066* (2013.01); *G11C 11/4093* (2013.01); *G11C 11/4096* (2013.01); *G11C 29/023* (2013.01); *G11C 29/028* (2013.01); *G11C 29/10* (2013.01); *G11C 29/50012* (2013.01); *G11C 2207/2254* (2013.01)

(58) Field of Classification Search
CPC .............. G11C 11/4076; G11C 11/409; G11C 29/12015; G11C 29/50012
USPC ....................................................... 365/194
See application file for complete search history.

(56) References Cited

U.S. PATENT DOCUMENTS

| | | |
|---|---|---|
| 6,094,375 A | 7/2000 | Lee |
| 6,760,856 B1 | 7/2004 | Borkenhagen et al. |

(Continued)

OTHER PUBLICATIONS

"Committee Letter Ballot", Ballot Template Version Draft, JEDEC Solid State Technology Association, 2011, 262 pages.

(Continued)

*Primary Examiner* — Hoai V Ho
*Assistant Examiner* — Minh Dinh
(74) *Attorney, Agent, or Firm* — Bryan Bortnick; Amy J. Pattillo

(57) ABSTRACT

A double data rate (DDR) memory controller writes a test pattern to a location in a DDR memory for a coarse calibration test, delayed by a first number of cycles set in a tunable write delay setting. The DDR memory controller simulates a single data rate (SDR) mode for the coarse calibration test by only comparing every other read beat of the test pattern read from the DDR memory, delayed by a second number of cycles set in tunable read delay setting, wherein every other read beat is latched for a full cycle. The DDR memory controller, responsive to every other read beat of the test pattern matching an expected result, sets the first number of cycles and the second number of cycles as coarse calibration settings for a DRAM.

20 Claims, 5 Drawing Sheets

(51) Int. Cl.
    *G11C 29/50* (2006.01)
    *G11C 7/10* (2006.01)
    *G11C 29/02* (2006.01)

(56) References Cited

U.S. PATENT DOCUMENTS

| | | |
|---|---|---|
| 6,870,776 B2 | 3/2005 | Kim et al. |
| 7,158,440 B2 | 1/2007 | Duh et al. |
| 7,165,185 B2 | 1/2007 | Li et al. |
| 7,243,254 B1 | 7/2007 | Kuroodi et al. |
| 7,454,672 B2 | 11/2008 | Lee et al. |
| 7,751,275 B2 | 7/2010 | Gronlund |
| 8,305,821 B2 * | 11/2012 | Ware .................. G06F 13/1689 365/185.05 |
| 8,453,096 B2 | 5/2013 | Magee et al. |
| 8,635,487 B2 | 1/2014 | Gower et al. |
| 8,843,778 B2 | 9/2014 | Lee et al. |
| 9,263,103 B2 | 2/2016 | Giovannini et al. |
| 9,432,179 B2 | 8/2016 | Stott et al. |
| 10,115,480 B1 * | 10/2018 | Gamini ................ G11C 7/1093 |
| 2008/0276133 A1 | 11/2008 | Hadley et al. |
| 2013/0076425 A1 | 3/2013 | Oh et al. |
| 2014/0258607 A1 | 9/2014 | Shim et al. |
| 2016/0035409 A1 | 8/2016 | Gopalan et al. |
| 2018/0174628 A1 * | 6/2018 | Yun ........................ G11C 7/222 |

OTHER PUBLICATIONS

Garside et al., "An Asynchronous Fully Digital Delay Locked Loop for DDR SDRAM Data Recovery", Advanced Processor Technologies Group, The University of Manchester, 2012 IEEE 18th Symposium on Asynchronous Circuits and Systems, 2012, pp. 49-56, 8 pages.

* cited by examiner

SIMULATING A SINGLE DATA RATE (SDR) MODE ON A DUAL DATA RATE (DDR) MEMORY CONTROLLER FOR CALIBRATING DDR MEMORY COARSE ALIGNMENT

BACKGROUND

1. Technical Field

This invention relates in general to a memory system calibration and more particularly to simulating a single data rate (SDR) mode on a dual data rate (DDR) memory controller for calibrating DDR memory coarse alignment.

2. Description of the Related Art

Computing systems generally include one or more circuits with one or more memory or storage devices connected to one or more processors via one or more controllers. Timing variations, frequency, temperature, aging and other conditions impact data transfer rates to and from memory or other storage, which impacts computer system performance. Given the high clock rates and fast edge speed used in many computer systems, timing variations and timing skews from one system implementation to another are challenging to calibrate, especially for systems with larger amounts of memory and a greater overall width of the memory bus.

BRIEF SUMMARY

In one embodiment, a method is directed to writing, by a double data rate (DDR) memory controller, a test pattern to a location in a DDR memory for a coarse calibration test, delayed by a first number of cycles set in a tunable write delay setting. The method is directed to simulating, by the DDR memory controller, a single data rate (SDR) mode for the coarse calibration test by only comparing every other read beat of the test pattern read from the DDR memory, delayed by a second number of cycles set in a tunable read delay setting, wherein every other read beat is latched for a full cycle. The method is directed to, responsive to every other read beat of the test pattern matching an expected result, setting, by the DDR memory controller, the first number of cycles and the second number of cycles as coarse calibration settings for a dynamic random-access memory (DRAM).

In another embodiment, a computer system comprises one or more processors, one or more computer-readable memories, one or more computer-readable storage devices, and program instructions, stored on at least one of the one or more storage devices for execution by at least one of the one or more processors via at least one of the one or more memories. The stored program instructions comprise program instruction to write, by a double data rate (DDR) memory controller, a test pattern to a location in a DDR memory for a coarse calibration test, delayed by a first number of cycles set in a tunable write delay setting. The stored program instructions comprise program instructions to simulate, by the DDR memory controller, a single data rate (SDR) mode for the coarse calibration test by only comparing every other read beat of the test pattern read from the DDR memory, delayed by a second number of cycles set in a tunable read delay setting, wherein every other read beat is latched for a full cycle. The stored program instructions comprise program instructions, responsive to every other read beat of the test pattern matching an expected result, to set, by the DDR memory controller, the first number of cycles and the second number of cycles as coarse calibration settings for a dynamic random-access memory (DRAM).

In another embodiment, a computer program product comprises one or more computer-readable storage devices and program instructions, stored on at least one of the one or more storage devices. The stored program instructions comprise program instruction to write, by a double data rate (DDR) memory controller, a test pattern to a location in a DDR memory for a coarse calibration test, delayed by a first number of cycles set in a tunable write delay setting. The stored program instructions comprise program instructions to simulate, by the DDR memory controller, a single data rate (SDR) mode for the coarse calibration test by only comparing every other read beat of the test pattern read from the DDR memory, delayed by a second number of cycles set in a tunable read delay setting, wherein every other read beat is latched for a full cycle. The stored program instructions comprise program instructions, responsive to every other read beat of the test pattern matching an expected result, to set, by the DDR memory controller, the first number of cycles and the second number of cycles as coarse calibration settings for a dynamic random-access memory (DRAM).

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth to provide a thorough understanding of the present invention. It will be apparent, however, to one skilled in the art that the present invention may be practiced without these specific details. In other instances, well-known structures and devices are shown in block diagram form to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Figure 1:
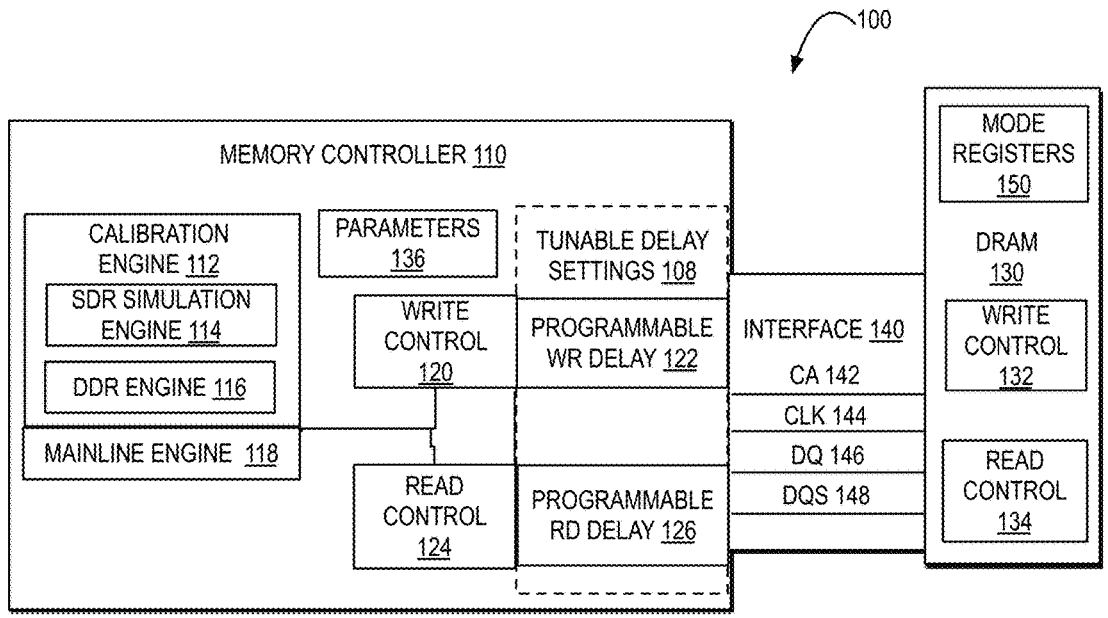
FIG. 1 is a block diagram illustrating one example of a memory system including a DDR memory controller for controlling a DDR memory in a DDR mode with a calibration controller for performing DDR timing based calibrations or simulating SDR timing based calibrations for coarse alignments and fine alignments on a DRAM with a 2 tCK preamble mode option.

FIG. 1 illustrates a block diagram of one example of a memory system including a DDR memory controller for controlling a DDR memory in a DDR mode with a calibration controller for performing DDR timing based calibrations or simulating SDR timing based calibrations for coarse alignments and fine alignments on a DRAM with a 2 tCK preamble mode option.

In one example, a memory system 100 may include a memory controller 110 for controlling one or more dynamic random-access memory (DRAM) devices, illustrated as DRAM 130. In one example, memory system 100 may include a dual in-line memory module (DIMM) or registered dual in-line memory module (RDIMM) implementing double data rate synchronous DRAM (DDR SDRAM) memory. In one example, the DDR memory may be one or more types of DDR memory, including, but not limited to DDR type three synchronous DRAM (DDR3 SDRAM) memory and DDR type four synchronous DRAM (DDR4 SDRAM). In one example, as described herein, DRAM 130 may generally refer to one or more types of memory including, but not limited to, traditional DRAM, static random access memory (SRAM), and electrically erasable programmable read-only memory (EEPROM), and other types of non-volatile memories. In one example, memory system 100 may represent one or more of one or more integrated circuits (IC), one or more an application specific ICs (ASIC), or one or more microprocessors. In additional or alternate examples, memory system 100 may represent any type of system that transmits data bidirectionally or unidirectionally between a controller and one or more memory chips.

In one example, memory system 100 may include a memory controller 110 for driving DRAM 130. In one example, an interface 140 connecting memory controller 110 and DRAM 130 may generally include any type of communication channel, which can be used to transmit signals and data between memory controller 110 and DRAM 130. In one example, interface 140 may implement bidirectional channels, which may include a write interface to transmit write commands and data from a write control 120 of memory controller 110 to a write control 132 of DRAM 130 and a read interface to transmit read commands and receive data between read control 124 of memory controller 110 and to read control 134 of DRAM 130. In one example, each of write control 120, read control 124, write control 132, and read control 134, may represent different combinations of hardware elements and different types of transmitters and receivers. In addition, memory controller 110 and DRAM 130 may include additional control elements including, but not limited to, command/address controls.

In one example, interface 140 may include one or more buses for a command/address/control (CA) 142, clock (CLK) 144, data (DQ) 146, and a data strobe (DQS) 148. In one example, CA 142 may pass commands, addresses, and control signals between memory controller 110 and DRAM 130. In one example, memory controller 110 may pass a differential clock signal generated by memory controller 110 to DRAM 130 as CLK 144, where DRAM 130 may sample all address and control inputs signals on CA 142 on the crossing of the positive edge of a clock true "t" and on the negative edge of a clock complement "c". In one example, DQ 146 may represent a bidirectional data input and output bus for data beats, referred to as DQ. In one example, write control 120 may pass write data to DRAM 130 and DRAM 130 may pass read data to memory controller 110 on DQ 146. In one example, DRAM 130 may output a data strobe on DQS 148 with read data on DQ 146 and may receive the data strobe on DQS 148 with write data received from memory controller 110.

In one example, a mainline engine 118 may control distribution of write and read commands to DRAM 130 at runtime, which may include, but is not limited to any time in which the data and address bus are not under control by calibration engine 112, unless DRAM 130 indicates a failure and is removed from mainline operation and recalibrated. Write control 120 may place write commands and data on interface 140. A write control 132 of DRAM 130 may represent a buffer for receiving write commands and data as triggered by DQS 148 and controlling the timing of writing the data to one or more memory chips of DRAM 130. Read control 124 may place read commands on interface 140 to DRAM 130. A read control 134 of DRAM 130 may represent a buffer for receiving read commands and controlling the timing of reading the data from one or more memory chips of DRAM 130 and returning the read data on interface 140. In one example, read control 124 may latch read data beats from DQ 146 during regular operation as triggered by a rising edge or a falling edge of DQS 148.

In one example, memory system 100 may operate over a range of one or more types of conditions, including, but not limited to, a range of voltage settings, a range of frequency settings, a range of timing parameters, and a range of temperature refresh rates. Additional conditions that may impact operation of memory system 100 may include, but are not limited to, timing, aging, and temperature. In one example, there may be a particular set of parameters within the range of conditions that allows for optimized operation within memory system 100, however, operation of memory system 100 within the optimized parameters requires calibration of one or more programmable, configurable settings within memory system 100 for the specification configuration of elements within memory system 100. In addition, as memory system 100 operates and temperature and other conditions cause timing skews, operation of memory system 100 within the optimized parameters requires continued calibration of one or more programmable, configurable settings within electronic circuit.

In one example, the timing of data and commands within interface 140 impacts the performance of memory system 100. In one example, to manage performance of memory system 100, there may one or more sets of parameters, such as parameters 136, for write operations and write data, read operations and read data, and control and address signals. In one example, parameters 136 may indicate latencies and windows of time acceptable for each of write data and read data on interface 140. In one example, when the timing of write data packets falls outside the edges, horizontally or vertically, of acceptable windows of time within parameters 136 or read data packets fall outside the edges, horizontally or vertically, of acceptable windows of time within parameters 136, the performance of electronic circuit 100 may diminish or fail. In one example, the parameters set for write control and read control in parameters 136 may be separate sets of parameters that are unrelated to one another and are impacted by different sets of circuitry within write and read interfaces and controls.

In one example, to configure interface 140 such that write data latencies and read data latencies meet parameters 136, across ranges of conditions, interface 140 is tunable through one or more tunable delay settings 108. For example, write data latencies are tunable across interface 140 through a programmable WR delay 122 of tunable delay settings 108 for the write interface between write control 120 and write control 132. In another example, read data latencies are tunable across interface 140 through a programmable RD delay 126 of tunable delay settings 108 for the read interface between read control 124 and read control 134. Tunable delay settings 108 may also include additional or alternate tunable delays for tuning command, control and address signals and other data and commands on interface 140.

In one example, to tune the timing on interface 140, each of the settings of each of tunable delay settings 108 may be selectively adjusted. For example, a user may manually tune or calibration engine 112 may automatically tune the write timing of DQ 146 by setting a timing delay of programmable WR delay 122 to selectively delay the timing of data output from write control 120 onto DQ 146 by an amount set in programmable WR delay 122. In addition, for example, a calibration engine 112 may tune the read timing of DQ 146 by setting a timing delay of programmable RD delay 126 to selectively delay the timing of read control 124 reading data as input from DQ 146 by an amount set in programmable RD delay 126.

In one example, each of the settings in tunable delay settings 108 may be set manually or may be set dynamically by calibration controller 112 prior to and during operations of memory controller 110 to values within an allowable range within parameters 136. In one example, one or more functions of calibration controller 112 may be performed by firmware or software that runs on memory system 100. In another example, one or more functions of calibration controller 112 may be performed by a tester controller external to memory system 100 that is connected to memory system 100. In another example, one or more functions of calibration controller 112 may be a hardware element of memory system 100 within memory controller 110 or DRAM 130 or as an independent component within memory system 100. In addition, one or more functions of calibration controller 112 may be distributed across a combination of hardware and software elements within memory system 100 and external to memory system 100.

In addition, for running tests on memory system 100, in one example, calibration controller 112 may load one or more test patterns into memory system 100. In another example, one or more components of memory system 100 may include internal test patterns or built in testing controllers for generating test patterns, where calibration controller 112 may run tests on memory system 100 by triggering one of the internal tests or built in test controllers within memory system 100.

In one example, the hardware of memory controller 110 is further configured for memory controller 110 to operate as a DDR controller, enabled to drive DRAM 130 as a DDR SDRAM, in which data is written and read on both rising and falling edges of DQS 148. In contrast, a single data rate controller allows data to be read on either the rising or falling edge of DQS 148. While the hardware configuration of a DDR controller may more complex when compared with a hardware configuration for a SDR controller, the hardware configuration of a DDR controller may allow for twice the data to be transferred as an SDR controller, without increasing the memory clock rate or bus width to accommodate for twice the data.

In addition, in the example, hardware of memory controller 110 is further configured in hardware for memory controller 110 to operate as a DDR controller enabled to drive DRAM 130 as a DDR4 SDRAM, and may also be enabled to drive DRAM 130 as other types of DDR SDRAM. In one example, DDR4 SDRAM may represent a high-speed dynamic random-access memory internally configured as sixteen-banks, 4 bank group with 4 banks for each bank group for ×4/×8 and eight-banks, 2 bank group with 4 banks for each bankgroup for ×16 DRAM. The DDR4 SDRAM may use a 8n prefetch architecture to achieve high-speed operation. The 8n prefetch architecture may be combined with an interface designed to transfer two data words per clock cycle at the I/O pins connected to interface 140. A single read or write operation for the DDR4 SDRAM may consist of a single 8n-bit wide, four clock data transfer at the internal DRAM core and eight corresponding n-bit wide, one-half clock cycle data transfers at the I/O pins connected to interface 140. Read and write operation to the DDR4 SDRAM may be burst oriented, start at a selected location, and continue for a burst length of eight or a 'chopped' burst of four in a programmed sequence. Operation may begin with the registration of an ACTIVATE Command and address bits to select the bank and row to be activated, which is then followed by a Read or Write command.

In particular, based on the specification of DDR4 SDRAM, DDR4 SDRAM may apply different signaling voltages, timings, and other factors than other types of DDR. In one example, to handle the signaling voltages, timings and other factors specified in the DDR4 specification, as well as other DDR specifications, calibration engine 112 may implement an SDR simulation engine 114 and a DDR engine 116. In one example, DDR engine 116 may drive regular DDR based calibration testing over DDR based buses of interface 140 to DRAM 130 using DDR based timing on DDR based hardware of memory system 100, writing and reading data on both the rising edge and falling edge of DQS 148. In one example, when activated, SDR simulation engine 114, may simulate SDR based calibration testing on DRAM 130 using SDR based timing on the DDR based hardware of memory system 100 to double the allowable margins during calibration without requiring any specific hardware dedicated to SDR based timing. SDR engine 114 may simulate SDR based calibration testing on DRAM 130 using SDR based timing on DDR based hardware of memory system 100 where DRAM 130 is functioning in DDR mode, without requiring DRAM 130 to function in a SDR mode or informing DRAM 130 that SDR simulation engine 114 is simulating SDR based calibration testing. In particular, while the hardware of interface 140 or DRAM 130 may be updated to include hardware specified for shifting DRAM 130 between operation in an SDR mode and a DDR mode, in the present invention, SDR simulation engine 114 simulates SDR mode on hardware of interface 140 and DRAM 130 specified for running DRAM 130 in DDR mode and does not require any hardware of interface 140 or DRAM 130 to specified for handling an SDR mode in order to simulate SDR based timing.

In one example, during an initial calibration of tunable delay settings 108, calibration engine 112 may set coarse and fine delays in tunable delay settings 108, through coarse calibrations, at a cycle level, and fine calibrations, at a sub-cycle level. In one example, to meet the specification of DDR4 SDRAM, for coarse write and read calibrations and fine write calibrations, SDR engine 114 may double the allowable margins by simulating SDR based calibration testing on DRAM 130 using SDR based timing on the DDR based hardware of memory system 100. In one example, to simulate SDR based calibration testing on DRAM 130, SDR engine 114 may double the allowable margins by optimizing every other beat of data, either the even or odd beats, of data within a pattern and holding every other beat of data in a read pattern for one clock cycle, ignoring half of the data, thereby simulating SDR timing. In one example, SDR engine 114 may select either an even beat optimization or an odd beat optimization. An even beat optimization results in the data on DQ 146 shifting earlier than the strobe on DQS 148 by half a clock cycle or DQS 148 being delayed by half a clock cycle. An odd beat results in the data on DQ 146 aligning with the strobe on DQS 148. In one example, by optimizing either the even beats or the odd beats of data, with a pattern held for one cycle, the amount of skew allowed is doubled from a quarter cycle to a half a cycle, assuming that DQS eyes are perfectly skewed. While SDR simulation engine 114 only compares half of the data, the simulated mode is only applied during calibration, not at runtime by mainline engine 118, and therefore does not impact the overall latency for memory operations during runtime.

In particular, based on the specification of DDR4 SDRAM, DDR4 SDRAM may include a programmable preamble mode of 1 tCK or 2 tCK, which impacts coarse calibration tests performed by calibration engine 112 and which is not included in the specifications of previous DDR SDRAM. In one example, when DRAM 130 is implemented as DDR4 SDRAM, DRAM 130 may include mode registers 150, including a tCK mode register which may be set during initialization to a 1 tCK or 2 tCK mode through a mode register set (MRS) command. In one example, the 2 tCK mode, in contrast to a 1 tCK mode, takes an extra cycle to drive low, to get a signal up, requiring the first write to each rank of DRAM 130 to have an additional cycle of preamble. In one example, the 2 tCK preamble mode may improve signal integrity by providing an additional cycle to get an electrical signal moving and pulsed up.

In the example, while the 2 tCK preamble mode in DDR4 SDRAM may improve signal integrity, the addition of programmable preamble mode of 2 tCK in mode registers 150 may impact initial calibration tests performed by calibration controller 112 to calibrate the DDR4 SDRAM of DRAM 130. In one example, the 2 tCK preamble mode may require that the first write to each rank have an additional cycle of preamble, which pushes all test data off by one cycle. A test sequence implemented by a calibration controller 112 tuned to control a DDR3 SDRAM may fail if applied to a DDR4 SDRAM because the DDR4 SDRAM may be set to a 2 tCK preamble mode, pushing all the test data off by one cycle. In the present invention, SDR simulation engine 114 may accommodate for either a 1 tCK or 2 tCK preamble mode setting by DDR engine 116 handling calibrations for the 1 tCK setting and SDR simulation engine 114 handling calibrations for the 2 tCK setting, simulating an SDR mode and optimizing coarse alignment calibration by holding either odd or even beats of data for one cycle, rather than a double rate cycle. In one example, where DRAM 130 is configured such that a first real write is required to a rank of DRAM 130, and then streaming writes to a rank are allowed, SDR simulation engine 114 may accommodate for the additional cycle of preamble by shifting the delay of the DQ signal in comparison with the DQS signal to optimize either odd or even beats of data with a pattern being held for one clock cycle.

In addition, the addition of an option for a 2 tCK preamble mode in the DDR4 SDRAM specification may impact how calibration engine 112 may perform coarse calibrations and fine write calibrations that include placing "dummy data" on DQ 146 before and after actual read data. In particular, in one example, a calibration controller calibrated for a DDR3 SDRAM, may have required the ability to put data that is used as a placeholder for testing, such as "dummy data", on the bus before and after reads, for a 1 tCK preamble mode. With the introduction of 2 tCK preamble mode in DDR4 SDRAM, the extra preamble cycle in combination with placing dummy data on the bus before and after a read, pushes off the first real write to the rank, which is required in DDR4 SDRAM before streaming writes to the rank are allowed. In the example, for DDR4 SDRAM to write the first write, the calibration controller needs to know the unit setting of the rank, but to know the unit setting of the rank, calibration engine 112 may need to calibrate tunable delay settings 108. In the example, SDR simulation engine 114 may accommodate for "dummy data" placed on DQ 146 before and after an actual read while tuning tunable delay settings 108 by holding the read data for one cycle and only comparing half of the data written in the test pattern to accommodate both coarse write and read calibrations and fine write calibrations.

In one example, during initialization, calibration engine 112 may first perform initial write leveling solutions to align the fine write calibration settings for DQS in tunable delay settings 108 to CLK 144 at the DRAM 130. Additionally, pre-programmed offsets may be applied to DQ in tunable delay settings 108 to approximate the expected best case DQ to DQS alignment. In one example, if memory system 100 includes significant skew between DQS 148 and DQ 146, the initial write leveling solutions may not center the fine write calibration solution in the DQ eye. In the example, SDR simulation engine 114 may also accommodate for significant skew between DQS 148 and DQ 146, while calibrating tunable delay settings 108 by doubling the eye size of DQ, to allow for an additional half cycle of skew for the eye during coarse cycle calibration. For example, while in DDR mode, the eye width is one quarter of cycle, in contrast, SDR simulation engine 114 doubles the allowable eye size of DQ to half a cycle to allow for coarse calibration at the cycle level with a larger eye size to accommodate for significant skew.

In one example, while SDR simulation engine 114 is described with reference to memory system 100, including a memory controller and DRAM 130, it will be understood by one skilled in the art that in additional or alternate embodiments SDR simulation engine 114 may also be implemented in additional or alternate types of controllers and chips for simulating SDR timing on hardware configured for DDR timing. For example, SDR simulation engine 114 may be implemented in a master chip connected to a slave chip. In addition, while SDR simulation engine 114 is described in FIG. 1 as a function of calibration engine 112, wherein the additional latency from SDR simulation engine 114 doubling the allowable margins only applies during a calibration phase, it will be understood by one skilled in the art that in additional or alternate embodiments SDR simulation engine 114 may also be performed independent of calibration engine 112 and may also be a function of mainline engine 118.

Figure 2:
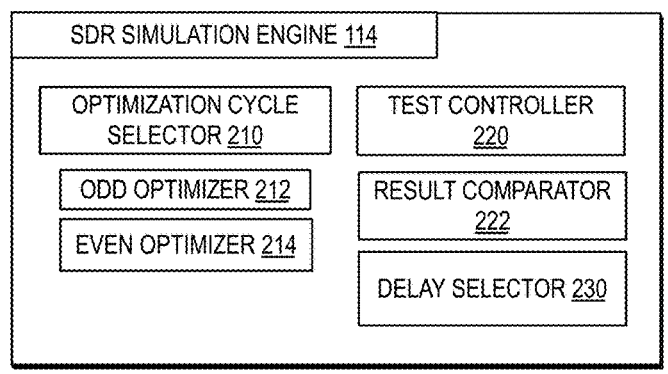
FIG. 2 is a block diagram illustrating one example of an SDR simulator engine of a calibration engine for simulating an SDR mode in a memory controller while the DRAM continues to operate in a DDR mode.

FIG. 2 illustrates a block diagram of one example of an SDR simulator engine of a calibration engine for simulating an SDR mode in a memory controller while the DRAM continues to operate in a DDR mode.

In one example, to perform coarse calibrations, calibration engine 112 may initially trigger SDR simulation engine 114 to set a number of cycles delay in tunable delay settings 108, which may include a coarse cycle delay setting of programmable WR delay 122 and set a number of cycles delay in a coarse cycle delay setting of programmable RD delay 126. In one example, delay selector 230 may initially select a base set of delay settings within an allowable range of delays in parameters 136 or a user may specify a particular base set of delay settings. In one example, delay selector 230 may initially guess a set of delay settings, such as delaying a write by 2 cycles and delaying a read by 3 cycles. In particular, delay selector 230 may initially guess the number of write cycles when DRAM 130 expects write data to come and when memory controller 110 expects read data to come, however, the delay registers for writes and read may differ.

In one example, SDR simulation engine 114 may apply an optimization cycle through an optimization cycle selector 210. In one example, optimization cycle selector 210 may apply an odd optimizer 212, for optimizing odd beats of data, or an even optimizer 214, for optimizing even beats of data. In one example, each of odd optimizer 212 and even optimizer 214 may adjust a test pattern to hold the same level for 2 times the number of DDR unit intervals (UIs), where a UI is the time it takes to latch one DDR data beat, to ensure that good timings and levels are reached. For example, if a DDR pattern is "01010101", then odd optimizer 212 may adjust the test pattern to "00110011" and even optimizer 214 may adjust the test pattern to "11001100", to simulate SDR mode.

In addition, optimization cycle selector 210 shifts the DQ delay in tunable delay settings 108 to optimize either odd or even beats of data within a test pattern. In one example, odd optimizer 212 may require DQ to be aligned with DQS by applying tunable delay settings 108. In one example, even optimizer 214 may require DQ to be shifted earlier than DQS by half a clock cycle within the DQ delay settings of tunable delay settings 108 or DQS being delayed by half a clock cycle within the DQ delay settings of tunable delay settings 108.

In the example, a test controller 220 of SDR simulation engine 114 may write a test data pattern to DRAM 130 and read the data written to DRAM 130. In one example, test controller 220 may also be implemented within calibration engine 112, and shared between SDR simulation engine 114 and DDR engine 116.

In one example, a result comparator 222 of SDR simulation engine 114 may compare the read result with an expected pattern for either odd beats or even beats only. In one example, if odd optimizer 212 is selected, then result comparator 222 selects to latch the read result only on the falling edge of DQS 148 and if even optimizer 214 is selected, then result comparator 222 selects to latch the odd result only on the rising edge of DQS 148. In particular, in the example, result comparator 222 further simulates SDR timing by comparing the expected pattern to the read data only on the odd or even optimized full cycle, rather than on both the rising edge and falling edge of each cycle. In the example, if result comparator 222 detects a match between the data read on only the odd or even optimized cycle and the corresponding odd or even expected pattern data, then the coarse alignment values set in tunable delay settings 108 are successful and calibration engine 112 may proceed to additional calibration testing. In one example, the coarse alignment values selected by SDR simulation engine 114 may then be applied by DDR engine 116 for performing fine write calibrations and other types of calibration sequences.

In one example, if result comparator 222 does not detect a match between the data read on only the odd or even optimized cycle and the corresponding odd or even expected pattern data, then delay selector 230 sets up new coarse delays within allowable ranges in parameters 136, such as by increasing or decreasing the delay cycles for read and writes, odd optimizer 212 or even optimizer 214 is applied for fine DQ delays, and the test pattern is re-run. If delay selector 230 applied all the delay options available for calibration within allowable ranges in parameters 136, then delay selector 230 may return an error.

In one example, the odd or even setting selected by optimization cycle selector 210 may be set by a user selection or may be automatically selected by optimization cycle selector 210. In one example, optimization cycle selector 210 may also switch between odd optimizer 212 and even optimizer 214 during calibration when delay selector 230 sets up new coarse delays. In one example, optimization cycle selector 210 may initially be set to select odd optimizer 212 or may initially be set to select even optimizer 214, and may switch to the other optimizer after running a training cycle. In addition, optimization cycle selector 210 may characterize which of odd optimizer 212 and even optimizer 214 runs more efficiently and select to run the optimizer that runs more efficiently. In additional or alternate examples, calibration engine 112 may include only one of odd optimizer 212 and even optimizer 214.

Figure 3:
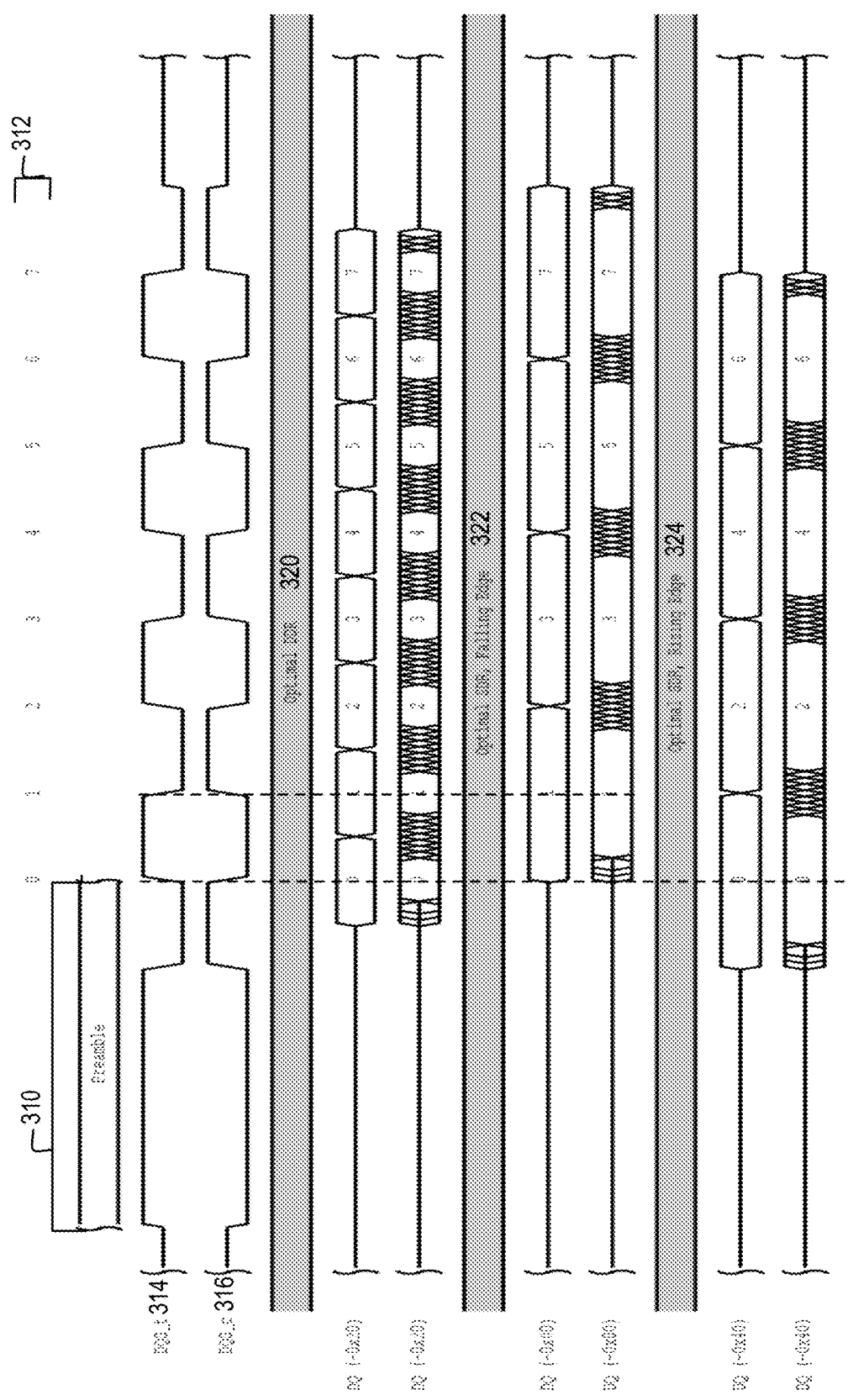
FIG. 3 is a timing diagram of one example of optimized tunable delays set for an optimized DDR mode, for an optimized odd beat SDR mode, and an optimized even beat SDR mode.

FIG. 3 illustrates a timing diagram of one example of optimized tunable delays set for an optimized DDR mode, for an optimized odd beat SDR mode, and an optimized even beat SDR mode.

In one example, a timing diagram 300 illustrates timing of DQS_t 314 and DQS_c 316 signals. In one example, timing diagram 300 illustrates a preamble 310 set to 2 tCK, lasting 2 clock cycles of DQS_t 314 and DQS_c 316.

In one example, an optimal DDR 320 illustrates an 8 beat DDR test pattern read, numbered 0-7. In the example, the coarse tunable delay settings have been set for the 8 beat DDR test pattern, with a predetermined fine setting delay of the DQ signal by one quarter of a clock cycle, specified for DDR to set a delay that is needed to hypothetically optimize the DQ to the DQS eye. In the example, optimal DDR 320 illustrates each half cycle of data with a quarter cycle eye during which DQS_t 314 and DQS_c 316 either rises or falls. In the example, when running in DDR mode, tunable delay settings 108 have been tuned by SDR simulation engine 114 to set tunable write delays and read delays, and tunable DQ and DQS delays, such that in DDR mode, the DQ eye of each beat of data aligns with a rising or falling edge of DQS_t 314 and DQS_c 316.

In one example, an optimal SDR, falling edge 322 illustrates the odd beats of the 8 beat DDR test pattern read, numbered 1, 3, 5, and 7, latched by result comparator 222 and compared with only the odd beats of an expected pattern. As illustrated, the DQ beats read in optimal SDR, falling edge 322 are delayed by half of a clock cycle in comparison with DQS_t 314 and DQS_c 316. In the example, the coarse tunable delay settings have been tuned by SDR simulation engine 114 to set tunable write delays and read delays, and tunable DQ and DQS delays, such that in simulated SDR mode, the widened DQ eye of every odd beat of data aligns with a falling edge of DQS_t 314 and a rising edge of DQS_c 316.

In one example, an optimal SDR, rising edge 324 illustrates the even beats of the 8 beat DDR test pattern read, numbered 0, 2, 4, and 6, latched by result comparator 222 and compared with only the even beats of an expected beat pattern. As illustrated, the DQ beats read in optimal SDR, rising edge 324 are aligned with the clock cycles of DQS_t 314 and DQS_c 316. In the example, the coarse tunable delay settings of tunable delay settings 108 have been tuned by SDR simulation engine 114 to set tunable write delays and read delays, and tunable DQ and DQS delays, such that in simulated SDR mode, the widened DQ eye of every even beat of data aligns with a rising edge of DQS_t 314 and a falling edge of DQS_c 316. In one example, SDR simulation engine 114 may tune the DQ delays in tunable delay settings 108 with respect to DQS_t 314 and DQS_c 316 or may tune the DQS delays with respect to the DQ read beats.

Figure 4:
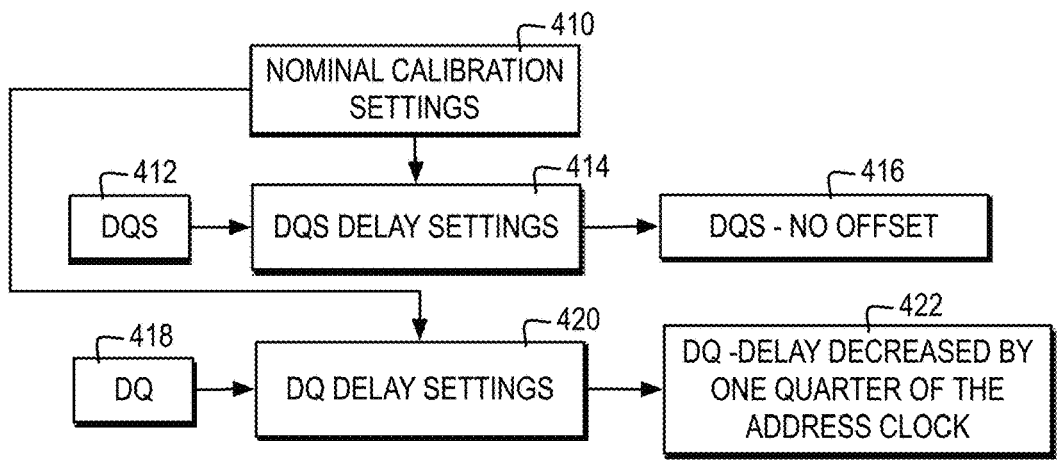
FIG. 4 is a block diagram of one example of a DDR engine applying calibration settings in tunable delay settings for calibration testing.

FIG. 4 illustrates a block diagram of one example of a DDR engine applying calibration settings in tunable delay settings for calibration testing.

In one example, DDR engine 116 may apply nominal calibration settings 410 to DQS delay settings 414 and DQ delay settings 420 of tunable delay settings 108. In one example, nominal calibration settings 410 are set for DDR mode, where a fine coarse DQ delay 422 is decreased by one quarter of a cycle. In one example, the delay of one quarter of a cycle reflects the allowable skew in DDR mode. In one example, one or more delay elements of interface 140 are adjusted to decrease the delay by one quarter of a cycle. In one example, as described with reference to FIG. 3, nominal calibration settings 410 may be set based on the results of SDR simulation engine 114 calibrating tunable delay settings 108, to achieve an optimal DDR alignment. In one example, the delay elements of interface 140 which may be adjusted to add delay of one quarter of a cycle may include, but are not limited to, phase rotators.

In one example, DQS 412, with DQS delay settings 414 applied, results in a DQS 416, with no offset. In the example, DQ 418, with DQ delay settings 420 applied, results in a DQ delay decreased by one quarter of the address clock.

Figure 5:
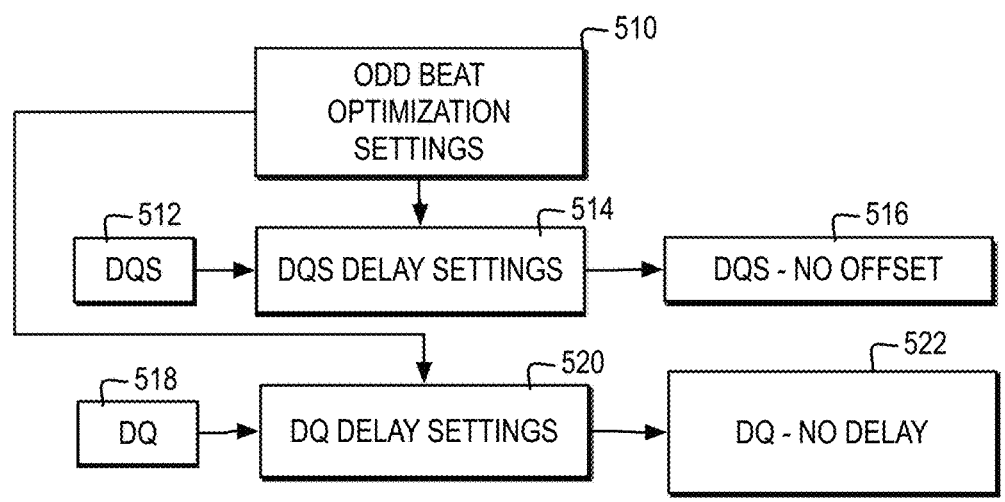
FIG. 5 illustrates a block diagram of one example of an SDR engine applying fine calibration settings in tunable delay settings for SDR mode based calibration testing that is optimized for odd beats.

FIG. 5 illustrates a block diagram of one example of an SDR engine applying fine calibration settings in tunable delay settings for SDR mode based calibration testing that is optimized for odd beats.

In one example, SDR simulation engine 114 may apply odd beat optimization settings 510 to DQS delay settings 514 and DQ delay settings 520 of tunable delay settings 108, with no fine coarse delay added by DQ delay settings 520. In one example, odd beat optimization settings 510 are set for simulated SDR mode, where the allowable margin for skew is double that of DDR mode, at half a cycle and the optimized read data beats are held for one clock cycle, read only on the falling edge of each cycle.

In one example, DQS 512, with DQS delay settings 514 applied, results in a DQS 516, with no offset. In the example, DQ 518, with DQ delay settings 520 applied, results in a DQ delay that is not changed.

Figure 6:
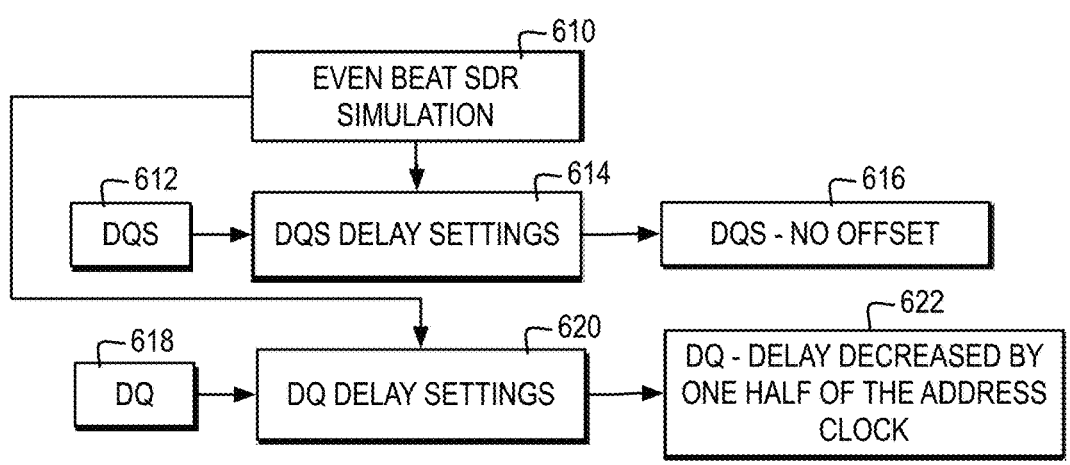
FIG. 6 illustrates a block diagram of an example of an SDR engine applying fine calibration settings in tunable delay settings for SDR mode based calibration testing that is optimized for even beats.

FIG. 6 illustrates a block diagram of an example of an SDR engine applying fine calibration settings in tunable delay settings for SDR mode based calibration testing that is optimized for even beats.

In one example, SDR simulation engine 114 may apply even beat optimization settings 610 to DQS delay settings 614 and DQ delay settings 620 of tunable delay settings 108, with a half cycle of fine coarse delay added by DQ delay settings 622. In one example, one or more delay elements of interface 140 are adjusted to decrease the fine coarse delay for the DQ by one half of a cycle. Alternatively, one or more delay elements of interface 140 may be adjusted to decrease the DQS by one quarter of a cycle. In one example, even beat optimization settings 610 are set for simulated SDR mode, where the allowable margin for skew is set to one half of a cycle and the optimized read data beats are held for one clock cycle, read on the rising edge of each cycle.

In one example, DQS 612, with DQS delay settings 614 applied, results in a DQS 616, with no offset. In the example, DQ 618, with DQ delay settings 620 applied, results in a DQ delay decreased by one half the address clock.

Figure 7:
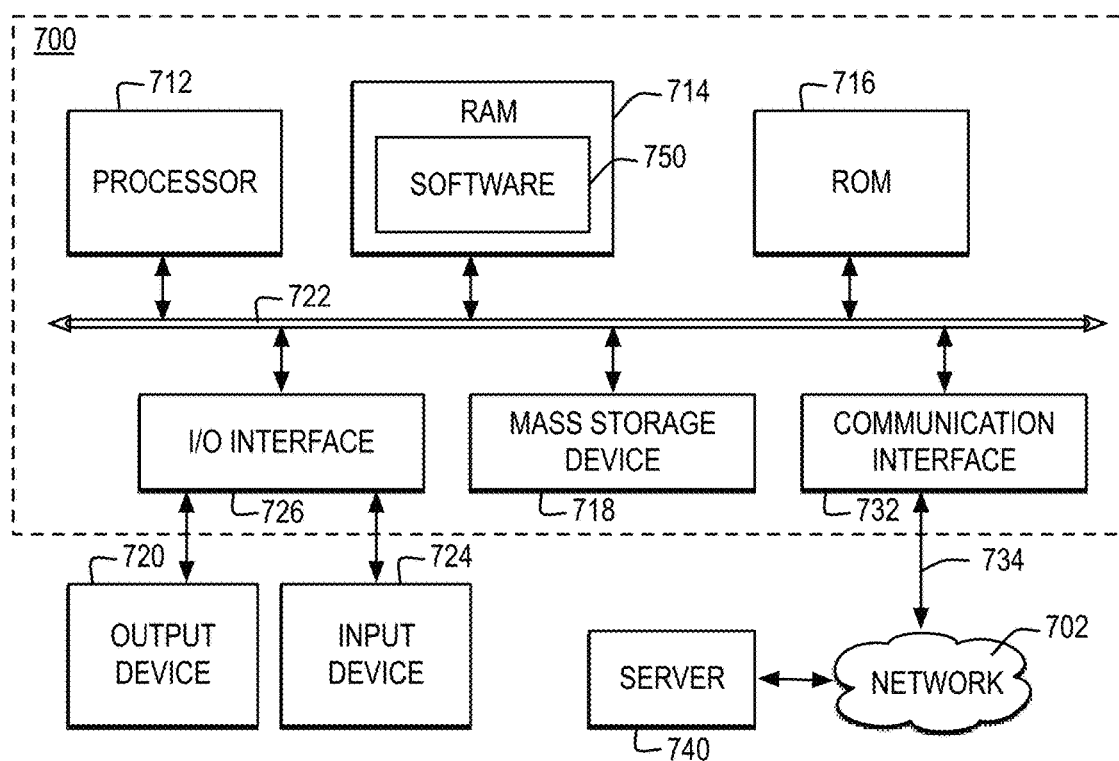
FIG. 7 is a block diagram illustrating one example of a computer system in which one embodiment of the invention may be implemented.

FIG. 7 illustrates a block diagram of one example of a computer system in which one embodiment of the invention may be implemented. The present invention may be performed in a variety of systems and combinations of systems, made up of functional components, such as the functional components described with reference to a computer system 700 and may be communicatively connected to a network, such as network 702.

Computer system 700 includes a bus 722 or other communication device for communicating information within computer system 700, and at least one hardware processing device, such as processor 712, coupled to bus 722 for processing information. Bus 722 preferably includes low-latency and higher latency paths that are connected by bridges and adapters and controlled within computer system 700 by multiple bus controllers. When implemented as a server or node, computer system 700 may include multiple processors designed to improve network servicing power.

Processor 712 may be at least one general-purpose processor that, during normal operation, processes data under the control of software 750, which may include at least one of application software, an operating system, middleware, and other code and computer executable programs accessible from a dynamic storage device such as random access memory (RAM) 714, a static storage device such as Read Only Memory (ROM) 716, a data storage device, such as mass storage device 718, or other data storage medium. Software 750 may include, but is not limited to, code, applications, protocols, interfaces, and processes for controlling one or more systems within a network including, but not limited to, an adapter, a switch, a server, a cluster system, and a grid environment.

Computer system 700 may communicate with a remote computer, such as server 740, or a remote client. In one example, server 740 may be connected to computer system 700 through any type of network, such as network 702, through a communication interface, such as network interface 732, or over a network link that may be connected, for example, to network 702.

In the example, multiple systems within a network environment may be communicatively connected via network 702, which is the medium used to provide communications links between various devices and computer systems communicatively connected. Network 702 may include permanent connections such as wire or fiber optics cables and temporary connections made through telephone connections and wireless transmission connections, for example, and may include routers, switches, gateways and other hardware to enable a communication channel between the systems connected via network 702. Network 702 may represent one or more of packet-switching based networks, telephony based networks, broadcast television networks, local area and wire area networks, public networks, and restricted networks.

Network 702 and the systems communicatively connected to computer 700 via network 702 may implement one or more layers of one or more types of network protocol stacks which may include one or more of a physical layer, a link layer, a network layer, a transport layer, a presentation layer, and an application layer. For example, network 702 may implement one or more of the Transmission Control Protocol/Internet Protocol (TCP/IP) protocol stack or an Open Systems Interconnection (OSI) protocol stack. In addition, for example, network 702 may represent the worldwide collection of networks and gateways that use the TCP/IP suite of protocols to communicate with one another. Network 702 may implement a secure HTTP protocol layer or other security protocol for securing communications between systems.

In the example, network interface 732 includes an adapter 734 for connecting computer system 700 to network 702 through a link and for communicatively connecting computer system 700 to server 740 or other computing systems via network 702. Although not depicted, network interface 732 may include additional software, such as device drivers, additional hardware and other controllers that enable communication. When implemented as a server, computer system 700 may include multiple communication interfaces accessible via multiple peripheral component interconnect (PCI) bus bridges connected to an input/output controller, for example. In this manner, computer system 700 allows connections to multiple clients via multiple separate ports and each port may also support multiple connections to multiple clients.

Figure 8:
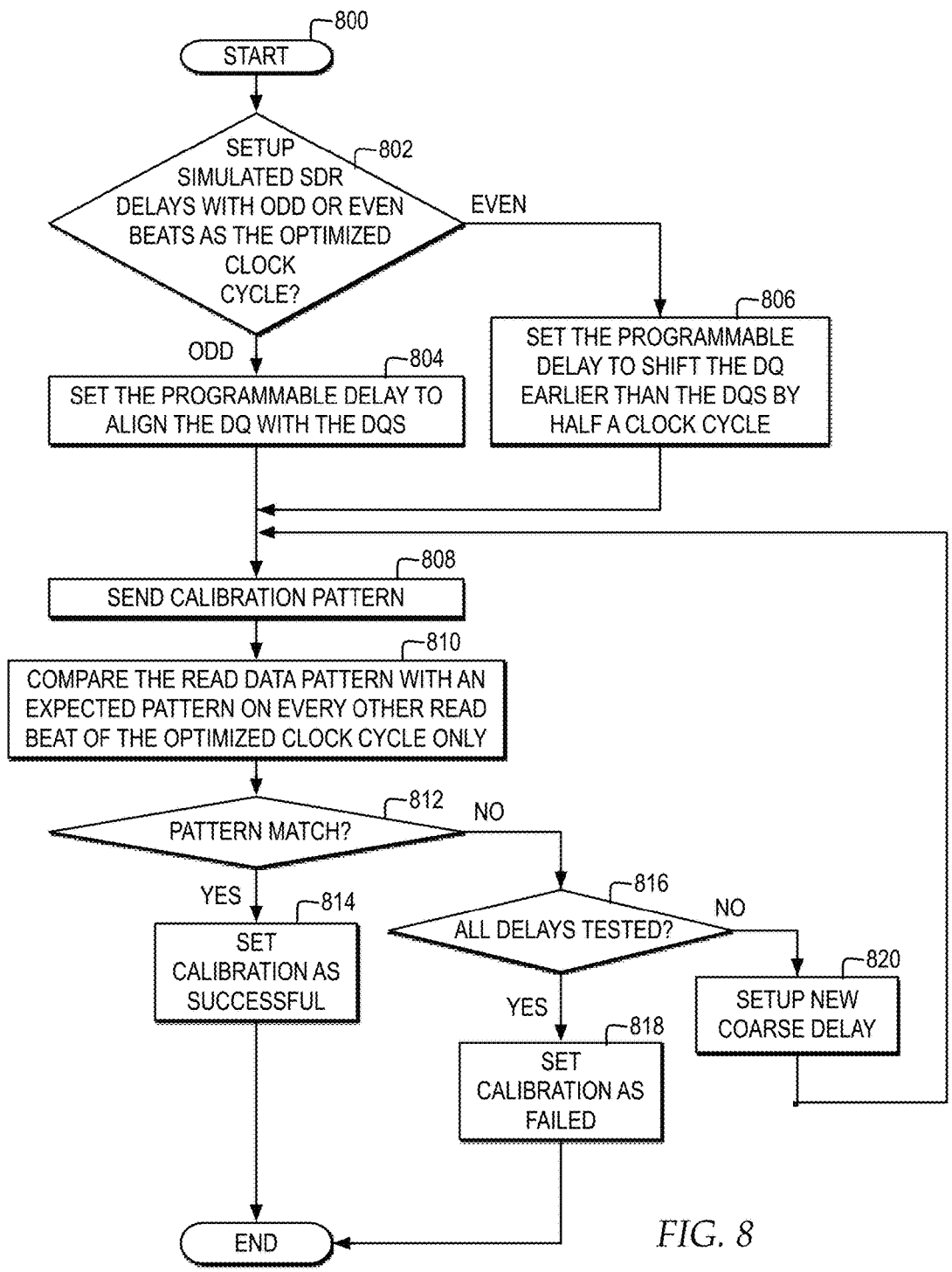
FIG. 8 illustrates a high level logic flowchart of a process and computer program for controlling coarse alignments by a DDR memory controller in a simulated SDR mode to calibrate a DDR SDRAM.

In one embodiment, the operations performed by processor 712 may control the operations of flowchart of FIG. 8 and other operations described herein. Operations performed by processor 712 may be requested by software 750 or other code or the steps of one embodiment of the invention might be performed by specific hardware components that contain hardwired logic for performing the steps, or by any combination of programmed computer components and custom hardware components. In one embodiment, one or more components of computer system 700, or other components, which may be integrated into one or more components of computer system 700, may contain hardwired logic for performing the operations of flowcharts in FIG. 8.

In addition, computer system 700 may include multiple peripheral components that facilitate input and output. These peripheral components are connected to multiple controllers, adapters, and expansion slots, such as input/output (I/O) interface 726, coupled to one of the multiple levels of bus 722. For example, input device 724 may include, for example, a microphone, a video capture device, an image scanning system, a keyboard, a mouse, or other input peripheral device, communicatively enabled on bus 722 via I/O interface 726 controlling inputs. In addition, for example, output device 720 communicatively enabled on bus 722 via I/O interface 726 for controlling outputs may include, for example, one or more graphical display devices, audio speakers, and tactile detectable output interfaces, but may also include other output interfaces. In alternate embodiments of the present invention, additional or alternate input and output peripheral components may be added.

With respect to FIG. 7, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Those of ordinary skill in the art will appreciate that the hardware depicted in FIG. 7 may vary. Furthermore, those of ordinary skill in the art will appreciate that the depicted example is not meant to imply architectural limitations with respect to the present invention.

FIG. 8 illustrates a high level logic flowchart of a process and computer program for controlling coarse alignments by a DDR memory controller in a simulated SDR mode to calibrate a DDR SDRAM.

In one example, the process and computer program begins at block 800 and thereafter proceeds to block 802. Block 802 illustrates a determination of whether there is a selection to setup simulated SDR delays for odd or even beats as the optimized clock cycle. At block 802, if there is a selection to setup simulated SDR delays for odd beats as the optimized clock cycle, then the process passes to block 804. Block 804 illustrates, for odd optimization, setting the programmable delay to align the DQ with the DQS, and the process passes to block 808. Returning to block 802, at block 802, if there is a selection to setup simulated SDR delays for even beats as the optimized clock cycle, then the process passes to block 806. Block 806 illustrates, for even optimization, setting the programmable delay to shift the DQ earlier than the DQS by half a clock cycle, and the process passes to block 808.

Block 808 illustrates sending a calibration pattern, including a write command and a read command, with the test pattern held for 2 times the DDR UI for either odd beats or even beats. Next, block 810 illustrates comparing the read data pattern with an expected pattern on every other beat of the optimized clock cycle only by latching data on the falling edge only for an odd beat optimization and by latching data on the rising edge only for an even beat optimization. Thereafter, block 812 illustrates a determination whether the read data from the DRAM matches the write pattern to the DRAM for the optimized clock cycle based on the selected even or odd delay.

At block 812, if the read data from the DRAM matches the write pattern to the DRAM for the optimized clock cycle, then the process passes to block 814. Block 814 illustrates setting the calibration as successful, and the process ends.

Returning to block 812, at block 812, if the read data from the DRAM does not match the write pattern to the DRAM for the optimized clock cycle, then the process passes to block 816. Block 816 illustrates a determination whether all delays have been tested in the allowable range of programmable delays in the parameters for the memory controller. At block 816, if all delays have been tested, then the process passes to block 818. Block 818 illustrates setting the calibration as failed, and the process ends.

Returning to block 816, if all delays have not been tested, then the process passes to block 820. Block 820 illustrates setting up new coarse delays in the programmable delay settings within the allowable range in the parameters for the memory controller, and the process returns to block 808.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A method comprising:
   writing, by a double data rate (DDR) memory controller, a test pattern to a location in a DDR memory for a coarse calibration test, delayed by a first number of cycles set in a tunable write delay setting;
   simulating, by the DDR memory controller, a single data rate (SDR) mode for the coarse calibration test by only comparing every other read beat of the test pattern read from the DDR memory, delayed by a second number of cycles set in a tunable read delay setting, wherein every other read beat is latched for a full cycle; and
   responsive to every other read beat of the test pattern matching an expected result, setting, by the DDR memory controller, the first number of cycles and the second number of cycles as coarse calibration settings for a dynamic random-access memory (DRAM).

2. The method according to claim 1, wherein writing, by the DDR memory controller, the test pattern to the location in the DDR memory for the coarse calibration test, delayed by the first number of cycles set in the tunable write delay setting further comprises:
   adjusting the test pattern to hold each of either an odd beat or an even beat for two times a DDR unit interval.

3. The method according to claim 1, wherein simulating, by the DDR memory controller, the SDR mode for the coarse calibration test by only comparing every other read beat of the test pattern read from the DDR memory, delayed by the second number of cycles set in the tunable read delay setting, wherein every other read beat is latched for the full cycle further comprises:
   simulating, by the DDR memory controller, the SDR mode for the coarse alignment test by only comparing every odd beat of the test pattern read from the DDR memory, wherein a programmable data bus delay is set to align with a data strobe signal for latching data read from the DDR memory, wherein the data strobe signal latches data read from the DDR memory on a falling edge of the data strobe signal.

4. The method according to claim 1, wherein simulating, by the DDR memory controller, the SDR mode for the coarse calibration test by only comparing every other read beat of the test pattern read from the DDR memory, delayed by the second number of cycles set in the tunable read delay setting, wherein every other read beat is latched for the full cycle further comprises:
   simulating, by the DDR memory controller, the SDR mode for the coarse alignment test by only comparing every even beat of the test pattern read from the DDR memory, wherein a programmable data bus delay is set to decreased delay by half a clock cycle in comparison to a data strobe signal for latching data read from the DDR memory, wherein the data strobe signal latches data read from the DDR memory on a rising edge of the data strobe signal.

5. The method according to claim 1, wherein simulating, by the DDR memory controller, the SDR mode for the coarse calibration test by only comparing every other read beat of the test pattern read from the DDR memory, delayed by the second number of cycles set in the tunable read delay setting, wherein every other read beat is latched for the full cycle further comprises:
   simulating, by the DDR memory controller, the SDR mode for the coarse alignment test by only comparing every even beat of the test pattern read from the DDR memory, wherein a programmable data strobe delay for latching data read from the DDR memory is set to delayed by a quarter of a clock cycle in comparison to a data bus signal of the data read from the DDR memory, wherein the data strobe signal latches data read from the DDR memory on a rising edge of the data strobe signal.

6. The method according to claim 1, further comprising:
   running, by the DDR memory controller, the coarse calibration test under the DDR mode with the tunable write delay setting set to the first number of cycles and the tunable read delay set to the second number of cycles and a programmable data bus delay is set to delayed by a quarter of a clock cycle in comparison to a data strobe signal for latching data read from the DDR memory, wherein the data strobe signal latches data read from the DDR memory on a rising edge and a falling edge of the data strobe signal.

7. The method according to claim 1, further comprising:
   responsive to every other read beat of the test pattern matching the expected result for the test pattern, setting, by the DDR memory controller, the first number of cycles and the second number of cycles as coarse calibration settings for the DDR memory.

8. The method according to claim 1, further comprising:
   prior to running the coarse calibration test, setting, by the DDR memory controller, the first number of cycles set in the tunable write delay setting to a first value within a parameter setting of an allowable range of write delays and the second number of cycles set in the tunable write delay setting to a second value within the parameter setting of an allowable range of read delays.

9. The method according to claim 1, further comprising:
   responsive to every other read beat of the test pattern not matching the expected result for the test pattern, setting, by the DDR memory controller, the first number of cycles and the second number of cycles as coarse calibration settings for the DRAM, determining whether all delays within a range of allowable write delays and all delays within an allowable range of read delays have been tested in the tunable write delay setting and the tunable read delay setting;

in response to detecting all delays within a range of allowable write delays and all delays within an allowable range of read delays have been tested in the tunable write delay setting and the tunable read delay setting, setting, by the DDR memory controller, the coarse calibration test as failed; and in response to detecting all delays within a range of allowable write delays and all delays within an allowable range of read delays have not been tested in the tunable write delay setting and the tunable read delay setting, setting, by the DDR memory controller, the tunable write delay setting to a next delay within the range of allowable write delays and setting the tunable read delay setting to a next delay within the range of allowable read delays.

10. The method according to claim 1, wherein writing, by the DDR memory controller, the test pattern to the location in the DDR memory for the coarse calibration test, delayed by the first number of cycles set in the tunable write delay setting further comprises:

writing, by the DDR memory controller, the test pattern to the DDR memory, comprising at least one DDR type 4 (DDR4) memory with a two cycle preamble mode selectable option.

11. A computer system comprising one or more processors, one or more computer-readable memories, one or more computer-readable storage devices, and program instructions, stored on at least one of the one or more storage devices for execution by at least one of the one or more processors via at least one of the one or more memories, the stored program instructions comprising:

program instruction to write, by a double data rate (DDR) memory controller, a test pattern to a location in a DDR memory for a coarse calibration test, delayed by a first number of cycles set in a tunable write delay setting;

program instructions to simulate, by the DDR memory controller, a single data rate (SDR) mode for the coarse calibration test by only comparing every other read beat of the test pattern read from the DDR memory, delayed by a second number of cycles set in a tunable read delay setting, wherein every other read beat is latched for a full cycle; and program instructions, responsive to every other read beat of the test pattern matching every other expected result, to set, by the DDR memory controller, the first number of cycles and the second number of cycles as coarse calibration settings for a dynamic random-access memory DRAM).

12. The computer system according to claim 11, wherein the stored program instructions to simulate, by the DDR memory controller, the SDR mode for the coarse calibration test by only comparing every other read beat of the test pattern read from the DDR memory, delayed by the second number of cycles set in the tunable read delay setting, wherein every other read beat is latched for the full cycle further comprise:

program instructions to simulate, by the DDR memory controller, the SDR mode for the coarse alignment test by only comparing every odd beat of the test pattern read from the DDR memory, wherein a programmable data bus delay is set to align with a data strobe signal for latching data read from the DDR memory, wherein the data strobe signal latches data read from the DDR memory on a falling edge of the data strobe signal.

13. The computer system according to claim 11, wherein the stored program instructions to simulate, by the DDR memory controller, the SDR mode for the coarse calibration test by only comparing every other read beat of the test pattern read from the DDR memory, delayed by the second number of cycles set in the tunable read delay setting, wherein every other read beat is latched for the full cycle further comprise:

program instructions to simulate, by the DDR memory controller, the SDR mode for the coarse alignment test by only comparing every even beat of the test pattern read from the DDR memory, wherein a programmable data bus delay is set to decreased delay by half a clock cycle in comparison to a data strobe signal for latching data read from the DDR memory, wherein the data strobe signal latches data read from the DDR memory on a rising edge of the data strobe signal.

14. The computer system according to claim 11, wherein the stored program instructions to simulate, by the DDR memory controller, the SDR mode for the coarse calibration test by only comparing every other read beat of the test pattern read from the DDR memory, delayed by the second number of cycles set in the tunable read delay setting, wherein every other read beat is latched for the full cycle further comprise:

program instructions to simulate, by the DDR memory controller, the SDR mode for the coarse alignment test by only comparing every even beat of the test pattern read from the DDR memory, wherein a programmable data strobe delay for latching data read from the DDR memory is set to delayed by a quarter of a clock cycle in comparison to a data bus signal of the data read from the DDR memory, wherein the data strobe signal latches data read from the DDR memory on a rising edge of the data strobe signal.

15. The computer system according to claim 11, the stored program instructions further comprising:

program instructions to run, by the DDR memory controller, the coarse calibration test under the DDR mode with the tunable write delay setting set to the first number of cycles and the tunable read delay set to the second number of cycles and a programmable data bus delay is set to delayed by a quarter of a clock cycle in comparison to a data strobe signal for latching data read from the DDR memory, wherein the data strobe signal latches data read from the DDR memory on a rising edge and a falling edge of the data strobe signal.

16. The computer system according to claim 11, the stored program instructions further comprising:

program instructions, responsive to every other read beat of the test pattern matching every other expected result for the test pattern, to set, by the DDR memory controller, the first number of cycles and the second number of cycles as coarse calibration settings for the DDR memory.

17. The computer system according to claim 11, the stored program instructions further comprising:

prior to running the coarse calibration test, program instructions to set, by the DDR memory controller, the first number of cycles set in the tunable write delay setting to a first value within a parameter setting of an allowable range of write delays and the second number of cycles set in the tunable write delay setting to a second value within the parameter setting of an allowable range of read delays.

18. The computer system according to claim 11, the stored program instructions further comprising:
   program instructions, responsive to every other read beat of the test pattern not matching an expected every other pattern, to set, by the DDR memory controller, the first number of cycles and the second number of cycles as coarse calibration settings for the DRAM, determining whether all delays within a range of allowable write delays and all delays within an allowable range of read delays have been tested in the tunable write delay setting and the tunable read delay setting;
   program instructions, in response to detecting all delays within a range of allowable write delays and all delays within an allowable range of read delays have been tested in the tunable write delay setting and the tunable read delay setting, to set, by the DDR memory controller, the coarse calibration test as failed; and
   program instructions, in response to detecting all delays within a range of allowable write delays and all delays within an allowable range of read delays have not been tested in the tunable write delay setting and the tunable read delay setting, to set, by the DDR memory controller, the tunable write delay setting to a next delay within the range of allowable write delays and setting the tunable read delay setting to a next delay within the range of allowable read delays.

19. The computer system according to claim 11, wherein the stored program instructions to write, by the DDR memory controller, the test pattern to the location in the DDR memory for the coarse calibration test, delayed by the first number of cycles set in the tunable write delay setting further comprise:
   stored program instructions to write, by the DDR memory controller, the test pattern to the DDR memory, comprising at least one DDR type 4 (DDR4) memory with a two cycle preamble mode selectable option.

20. A computer program product comprising one or more computer-readable storage devices and program instructions, stored on at least one of the one or more storage devices, the stored program instructions comprising:
   program instruction to write, by a double data rate (DDR) memory controller, a test pattern to a location in a DDR memory for a coarse calibration test, delayed by a first number of cycles set in a tunable write delay setting;
   program instructions to simulate, by the DDR memory controller, a single data rate (SDR) mode for the coarse calibration test by only comparing every other read beat of the test pattern read from the DDR memory, delayed by a second number of cycles set in a tunable read delay setting, wherein every other read beat is latched for a full cycle; and
   program instructions, responsive to every other read beat of the test pattern matching every other expected result, to set, by the DDR memory controller, the first number of cycles and the second number of cycles as coarse calibration settings for a dynamic random-access memory (DRAM).

* * * * *